United States Patent [19]

Lanig

[11] 4,236,297
[45] Dec. 2, 1980

[54] METHOD OF MANUFACTURING A SUPERCONDUCTOR

[75] Inventor: Peter Lanig, Erlangen, Fed. Rep. of Germany

[73] Assignee: Siemens Aktiengesellschaft, Berlin and Munich, Fed. Rep. of Germany

[21] Appl. No.: 925,797

[22] Filed: Jul. 18, 1978

[30] Foreign Application Priority Data

Jul. 29, 1977 [DE] Fed. Rep. of Germany ....... 2734410

[51] Int. Cl.³ ............................................. H01L 39/24
[52] U.S. Cl. ...................................................... 29/599
[58] Field of Search ............................................ 29/599

[56] References Cited

U.S. PATENT DOCUMENTS

| | | | |
|---|---|---|---|
| 3,327,370 | 6/1967 | Cohen | 29/599 |
| 3,333,331 | 8/1967 | Swartz | 29/599 |
| 3,528,172 | 9/1970 | Smulkowski | 29/599 X |
| 3,603,716 | 9/1971 | Koren et al. | 29/599 X |

Primary Examiner—Francis S. Husar
Assistant Examiner—V. K. Rising
Attorney, Agent, or Firm—Kenyon & Kenyon

[57] ABSTRACT

A method of manufacturing a superconductor, in which an intermediate conductor product of two components of a superconductive compound to be produced is first placed on a winding core and separating means comprising a graphite fabric or a graphite foil disposed between adjacent surface parts then, the superconductive compound is formed by a heat treatment and, finally, the superconducting body so produced is unwound from the winding core for further processing, to avoid fritting together of the surface parts and, at the same time, troublesome layers on the fabricated superconductor.

8 Claims, 3 Drawing Figures

METHOD OF MANUFACTURING A SUPERCONDUCTOR

BACKGROUND OF THE INVENTION

This invention relates to superconductors in general and more particularly to an improved method of manufacturing a superconductor.

Superconductive intermetallic compounds of the type $A_3B$ with an A-15 crystal structure such as, for instance, $Nb_3Sn$ or $V_3Ga$ have very good superconduction properties and are distinguished, in particular, by a high critical magnetic field $B_{c2}$, a high transition temperature $T_c$ and a high critical current density $j_c$. Conductors with these materials are, therefore, suitable especially for superconducting magnet coils to produce strong magnetic fields. Besides these binary compounds, ternary compounds such as niobium-aluminum-germanium $Nb_3Al_{0.8}Ge_{0.2}$ are also of special interest for conductors of such magnets.

However, these intermetallic compounds are generally very brittle, so that manufacturing them in a form suited, for instance, for magnet coils present difficulties. Special processes have therefore been developed, by which superconductors with these compounds can be produced in the form of long wires or ribbons. These processes allow, in particular, the manufacture of so-called multi-core conductors which contain a matrix of normally conducting material, in which wires of the compounds mentioned, e.g., $Nb_3Sn$ or $V_3Ga$ wires or niobium or vanadium wires, with surface layers of these compounds, are embedded. In such a process, a first component, which is in general a ductile element in wire form such as a niobium or vanadium wire, is surrounded by a jacket of a further component. This component consists, for instance, of a ductile carrier metal and an alloy containing the remaining elements of the compound, for instance, it consists of a copper-tin alloy or a copper-gallium alloy. A multiplicity of such wires can also be embedded in a matrix of the alloy. The assembly of these two components is then subjected to a cross-section reducing treatment. In this manner, a long wire is obtained such as is required for coils. In addition, the diameter of the wire cores, which consist of niobium or vanadium, is reduced with this treatment to a low value in the order of about 30 to 50 μm or less, and the superconduction properties of the conductor ultimately produced are improved thereby. Furthermore, a good metallurgical bond is obtained by this process step between the wire cores and the matrix material of the alloy surrounding them, without the occurence of reactions that would embrittle the conductor. After the reduction of the cross-section, the intermediate conductor product of a superconductor, consisting of one or several wire cores and the surrounding matrix material, is then subjected to a heat treatment in such a manner that the desired superconductive compound is formed by a reaction of the core material with the other element of the compound which is contained in the surrounding matrix. The element contained in the matrix diffuses into the core material which consists of the other element of the compound and reacts with the latter, forming a layer consisting of the desired intermetallic compound British Pat. No. 1,280,583.

Superconducting magnet coils of such superconductors are generally produced according to two different methods. In the first method, which is also called the "wind-and-react technique", one first winds the not yet reacted intermediate conductor product of the superconductor on the coil form and then subjects the entire coil so wound to a diffusion anneal.

One thereby circumvents all difficulties in the processing of a brittle conductor material. It is also possible in this manner to make coils with a very small inside diameter with still relatively heavy conductors. In this method, however, all the materials required in the construction of the coil must be able to withstand the high temperature required for a diffusion anneal, which in the case of niobium-tin are above 700° C., for several hours.

The second method for manufacturing superconducting magnet coils with the superconductors mentioned is the so-called "react first-then wind" method. With this method, the intermediate conductor product of the superconductor to be manufactured is wound on a temporary winding core and is then subjected to the required heat treatment for forming the superconductive compound. Subsequently thereto, the superconductor so produced is unwound from the winding core and can be processed further. In this process, however, there is danger of the turns being fritted together, and to the winding substrate, during the heat treatment. To prevent this fritting together, special separator means are necessary which must be arranged between the individual turns of the intermediate conductor product. Copper-beryllium and tantalum foils, for instance, are used as the separator means. However, these separator foils are relatively expensive. With them, there is also the danger of damage to the superconductor at butt joints at which individual parts of these foils are put together as well as the transitions from one layer to the next layer of the superconductor on the winding core in a multi-layer arrangement. Although this danger does not exist if separating means such as magnesium sludge U.S. Pat. No. 3,829,963 or a carbon coating U.S. Pat. No. 3,807,041 are used, the turns can touch at some points if these separating means are used, in case the turns become loose during the annealing operation. The turns then can frit together at these contact points. In addition, troublesome layers remain on the superconductor so produced, which only must be removed again in a secondary operation.

In addition, superconductors several kilometers long are often required for the construction of large magnets. Since, as is well known, solder joints between individual superconductor sections are sources of trouble, the requirement of large conductor lengths necessitates in general a multi-layer arrangement on the winding core for diffusion anneal, in which the individual layers of the intermediate conductor product must be separated from each other reliably.

The multi-core conductors manufactured by this second method are, in addition, also very sensitive to flexure and tension. For, their brittle A-15 phases are in general embedded in a soft material, e.g., bronze, which can take up only small mechanical loads. Excessive elongation of the conductor must therefore be avoided.

A further difficulty occurs due to a permanent length change of multi-core conductors produced by this method after the diffusion anneal, i.e., the turns applied lie only loosely on the respective substrate after the anneal, so that, in unwinding, the upper layers can slide into the ones below and can thus not be separated without damage.

SUMMARY OF THE INVENTION

It is therefore an object of the present invention to describe a method for manufacturing a superconductor according to the "react first-then wind" technique, in which the difficulties mentioned do not occur or in which they occur only to an insignificant extent.

For a method of manufacturing a superconductor with at least one strand of a superconductive compound which is formed from two components, wherein an intermediate conductor product with these components is first placed on a winding core, and carbon containing separator means are provided at least between adjacent surface parts of this intermediate conductor product; subsequently thereto, a heat treatment is performed to form the superconductive compound; and finally, the superconducting body so produced is unwound from the winding core for further processing this problem is solved, according to the present invention, by using a coherent structure of graphite as the separator means. Avantageously, such a cohrent structure of graphite is a fabric or a foil.

The advantages of this method are, in particular, that a thin layer of the coherent graphite structure has very good separating properties and is also somewhat elastic, so that the loosening of the winding during the heat treatment step for forming the superconductive compound is minimized. Such a coherent graphite structure can furthermore be put together without a lap joint, for instance, by cementing. Since these separating means do not enter into reactions of any kind with the components of the intermediate conductor product, they also leave no troublesome layers on the superconductor manufactured by this method.

Advantageously, several layers of the intermediate conductor product can be wound on the winding core, leaving a predetermined space between the adjoining turns of each layer. The winding core, as well as every layer of the winding, except for the outermost layer of the winding, can be enclosed without a lap joint by the graphite structure. In such a multi-layer arrangement, the individual layers are separated reliably from each other during the heat treatment for forming the superconductive compound by means of the separator means. Also, the individual turns of a layer are separated due to the spaces provided between them. Because of those measures, fritting together of the individual turns and the danger of degradation of the super-conduction conductor properties due to joints are eliminated.

DETAILED DESCRIPTION OF THE INVENTION

Figure 1:
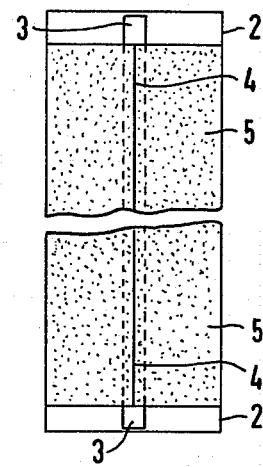
FIG. 1 is a plan view of a winding core according to the present invention with a graphite structure placed thereover.
Figure 2:
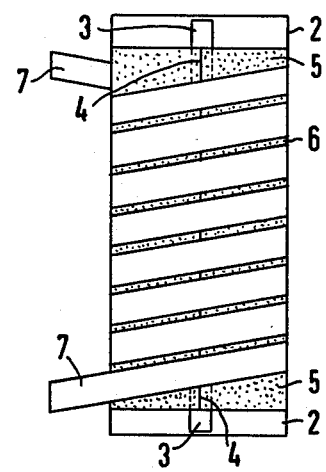
FIG. 2 is a similar view illustrating the winding core wound with an intermediate conductor product.

The illustrated embodiment is based on the manufacture of an $Nb_3Sn$ multi-core conductor by the method according to the present invention. First, an intermediate conductor product is formed which can contain, in a manner known per se, a multiplicity of niobium elements as the first component, which are embedded in a bronze matrix as the second component. The bronze matrix has, for instance, a rectangular cross section 0.65 mm×0.25 mm and contains 1, 615 niobium filaments. Since a winding core 2, which consists, for instance, of a tube of stainless steel (e.g., V2A steel) about 155 mm long and with a diameter of 55 mm, which is beaded over at its ends, is to be wound with several hundred meters of this intermediate conductor product, a multilayer winding is necessary on this winding core. Before the first layer of the intermediate conductor product is wound on the winding core, the cylindrical surface of this winding core to be wound is first covered with a layer of a graphite fabrics which is, for instance, 0.15 mm thick as shown on FIG. 1. The graphite fabric is advantageously fastened to the winding core in such a manner, for instance, by cementing, that no joints occur. This can be accomplished by using plastic tape 3 which has adhesive on both sides. The tape 3 is cemented to the winding core 2 in the axial direction and has an initial web section of the graphite fabric attached to its center. The graphite fabric 5 is placed around the cylindrical winding surface of the winding core and is cemented to the other half of the adhesive tape 3. Excess graphite fabric is then cut off, so that no prominence is produced at the joint 4 so generated. Thus, a closed wrapping 5 about the cylinder surface to be wound on the winding core 2, with a lengthwise seam, is generated. As shown on FIG. 2, around this wrapping 5, the first layer of the intermediate conductor product is now wound helically with such a pitch that a predetermined small spacing 6 between adjoining turns is developed. Due to this spacing, the individual turns are prevented from baking together in a subsequent diffusion anneal. In the cross section of the FIG., the rectangular shape of the cross section area 7 of the intermediate conductor product as well as some of the filaments embedded in the matrix can be seen.

Figure 3:
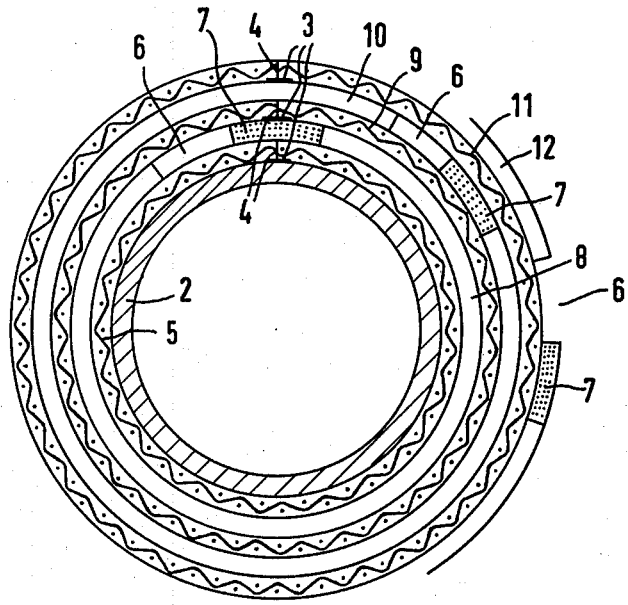
FIG. 3 is a cross-section through the arrangement of FIG. 2 showing a plurality of such windings with a graphite structure between each layer.

As is evident from the cross-section view of FIG. 3, the first layer 8 of the winding, thus formed from the individual turns of the intermediate conductor product, is now wrapped with a further covering 9 of graphite fabric, which is made in the same manner as the wrapping 5. A further layer 10 of the intermediate conductor product can be wound around this wrapping 9, care being taken that excessive deformation of the intermediate conductor product is avoided in the transition from layer 8 to layer 10. For this reason, the graphite fabric also must not be too thick since, otherwise, a step could be formed at the transition to the next layer.

In FIG. 3, still another wrapping 11 of graphite fabric is indicated which surrounds this layer 10 of the intermediate conductor product. A further layer 12 of the intermediate conductor product is wound on this wrapping 11. The outermost layer of the intermediate conductor product need not be enclosed by a graphite fabric.

In FIG. 3, only three layers of the intermediate conductor product are shown. Depending on the length of the superconductor to be produced, however, substantially more layers, with wrappings in between, may become necessary.

During the winding operation, the graphite fabric is held on the respective winding substrate, i.e., either on the winding core 2 or on a layer wound of the intermediate conductor product, of the adhesive strips 3. Adhesives suitable for this purpose do not enter into reaction with the conductor materials and also leave no cover layers on the final conductor product. Tesa film about 15 mm wide with adhesive on both sides, for instance, is suitable as the adhesive strip.

The winding core wound with the intermediate conductor product can now be baked out in a vacuum at a temperature which is below the diffusion temperature for forming the superconductive compound, to drive out binder from the graphite fabric and the adhesive at the joints 4 in the wrappings 5, 9, 11 of graphite fabric. Also the plastic foils 3 carrying the adhesive are advantageously converted to carbon. The completely wound winding core can be baked out, for instance, for one hour at 500° C.

After this baking out operation, the diffusion anneal for forming the superconductive intermetallic compound takes place, for instance, at 700° C. for 24 hours. After the diffusion anneal, the superconducting $Nb_3Sn$ multi-core conductor so produced can be unwound from the winding core. As there is practically no residue on the surface of this conductor, it can be readily tinned and soldered. By soldering several such rectangular conductors together side by side, a conductor with a large side ratio is obtained, which then is more flexible than, for instance, a round conductor with the same cross-section area. At the same time, the so-called $I_c$-degradation of this conductor also remains smaller, due to the so-called anisotropy effect, than in a monolithic rectangular conductor with the same dimensions. For the construction of the coil, soldering also permits efficient grading of the winding with a single standard conductor.

Although the illustrated embodiment was based on a manufacturing method for forming the superconductive intermetallic compound $Nb_3Sn$, the method according to the present invention is equally well suited for all known superconductive compounds which are developed by heat treatment from two components of at least one element by a diffusion technique. Such compounds are, for instance $V_3Ga$ or $V_3Si$.

In the embodiment according to the figure, the assumption of a graphite fabric as the coherent graphite structure was made. However, the coherent graphite structure may also be a graphite mesh, a graphite cloth, a graphite tissue, a graphite web, a graphite netting, a graphite foil or a graphite film.

What is claimed is:
1. A method of manufacturing a superconductor with at least one strand of a superconductive compound which is formed from at least two components, comprising:
    (a) winding an intermediate conductor product with these components on a winding core;
    (b) separately winding a coherent graphite structure as a separator at least between adjacent surface parts of said intermediate conductor product;
    (c) subsequently thereto, performing a heat treatment for forming the superconductive compound; and
    (d) finally, unwinding the superconducting body so produced from the winding core for further processing.
2. The method according to claim 1, wherein said step of placing comprises wrapping the winding core with several layers of the intermediate conductor product, leaving a predetermined space between adjacent turns of the layers; and wrapping the winding core and each layer of the winding, to form a cylindrically contiguous cover except for the outermost layer of the winding, with the graphite structure.
3. The method according to claim 2, wherein parts of the graphite structure are cemented together, using adhesive.
4. The method according to claim 3, and further including driving out, prior to the heat treatment for forming the superconductive compound, the adhesive required for the cementing in a vacuum at a temperature lower than the heat treatment temperature.
5. The method according to claim 4, wherein a thin adhesive film which is converted to carbon at said lower temperature is used.
6. The method according to one of the claims 1 to 5, wherein several layers are wound on the winding core and wherein a graphite structure with a thickness which is smaller than the thickness of the intermediate conductor product is used.
7. The method according to claim 1 wherein said coherent graphite structure comprises a woven graphite fabric.
8. The method according to claim 1 wherein said coherent graphite structure comprises a graphite foil.

* * * * *